United States Patent
Goyal

(10) Patent No.: US 7,181,359 B2
(45) Date of Patent: Feb. 20, 2007

(54) METHOD AND SYSTEM OF GENERIC IMPLEMENTATION OF SHARING TEST PINS WITH I/O CELLS

(75) Inventor: Saket K. Goyal, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/988,081

(22) Filed: Nov. 12, 2004

(65) Prior Publication Data

US 2006/0106563 A1    May 18, 2006

(51) Int. Cl.
    *G01R 27/28* (2006.01)
(52) U.S. Cl. .................. 702/117; 702/123; 714/724; 714/725; 714/741; 716/4; 716/12; 716/17
(58) Field of Classification Search ............... 702/117, 702/123; 714/724, 725, 741; 716/4, 12, 716/17
    See application file for complete search history.

(56) References Cited

U.S. PATENT DOCUMENTS

| | | | | |
|---|---|---|---|---|
| 5,546,408 A * | 8/1996 | Keller | ................... | 714/741 |
| 6,304,837 B1 * | 10/2001 | Geiger et al. | .............. | 703/14 |
| 6,331,790 B1 * | 12/2001 | Or-Bach et al. | ............. | 326/41 |
| 6,456,961 B1 * | 9/2002 | Patil et al. | .................. | 703/14 |
| 6,539,533 B1 * | 3/2003 | Brown et al. | ................. | 716/17 |
| 6,584,590 B1 * | 6/2003 | Bean | ..................... | 714/724 |
| 6,754,862 B1 * | 6/2004 | Hoyer et al. | ............... | 714/725 |
| 6,865,723 B2 * | 3/2005 | Lackey | ........................ | 716/4 |
| 6,948,145 B2 * | 9/2005 | Brown et al. | ................. | 716/12 |
| 2004/0221197 A1 * | 11/2004 | Goyal et al. | ................. | 714/25 |

\* cited by examiner

*Primary Examiner*—Carol S. W. Tsai
(74) *Attorney, Agent, or Firm*—Suiter-Swantz PC LLO

(57) ABSTRACT

The present invention provides a method and a system of generic implementation of sharing test pins with I/O cells. The method includes a step of making a general change in a testlib file. The testlib file is suitable for controlling I/O cell pins to gain test access. The general change restricts I/O cells for sharing with test pins. The method further includes a step of making iogen changes for sharing. Optionally, the method may include a step of making a cell level change in the testlib file. The cell level change overrides restrictions defined by the general change.

17 Claims, 2 Drawing Sheets

Making a general change in a testlib file, said testlib file being suitable for controlling I/O cell pins to gain test access, said general change restricting I/O cells for sharing with test pins — 202

Making iogen changes for sharing — 204

Making a cell level change in said testlib file, said cell level change overriding restrictions defined by said general change — 206

| Symbolic Name | Description |
|---|---|
| scan_in | Symbolic Name for LSI_SCAN_IN pin |
| lbram_scan_in | Symbolic Name for LSI_LBRAM_SCAN_IN pin |
| mbisr_scan_in | Symbolic Name for LSI_MBISR_SCAN_IN pin |
| fuse_scan_in | Symbolic Name for LSI_FUSE_SCAN_IN pin |
| scan_out | Symbolic Name for LSI_SCAN_OUT pin |
| lbram_scan_out | Symbolic Name for LSI_LBRAM_SCAN_OUT pin |
| mbisr_scan_out | Symbolic Name for LSI_MBISR_SCAN_OUT pin |
| fuse_scan_out | Symbolic Name for LSI_FUSE_SCAN_OUT pin |
| scan_clock | Symbolic Name for LSI_SCAN_CLOCK pin |
| test_cw_in | Symbolic Name for LSI_TEST_CW_IN pin |
| test_cw_out | Symbolic Name for LSI_TEST_CW_OUT pin |
| pll_t0 | Symbolic Name for LSI_PLL_T[0] pin |
| pll_t1 | Symbolic Name for LSI_PLL_T[1] pin |
| mbist_clock | Symbolic Name for LSI_MBIST_CLK pin |
| scan_resetn | Symbolic Name for LSI_SCAN_RESETN pin |
| scan_setn | Symbolic Name for LSI_SCAN_SETN pin |
| scan_setresetn | Symbolic Name for LSI_SCAN_SETRESETN pin |
| pll_ref_clk | Symbolic Name for LSI_PLL_REF_CLK pin |
| pll_resetn | Symbolic Name for LSI_PLL_RESETN pin |
| pll_lock | Symbolic Name for LSI_PLL_LOCK pin |
| lbram_scan_clock | Symbolic Name for LSI_LBRAM_SCAN_CLOCK pin |
| cw_tap_tdi | Symbolic Name for LSI_CW_TAP_TDI pin |
| cw_tap_tck | Symbolic Name for LSI_CW_TAP_TCK pin |
| cw_tap_tms | Symbolic Name for LSI_CW_TAP_TMS pin |
| cw_tap_trstn | Symbolic Name for LSI_CW_TAP_TRSTN pin |
| mbisrc_flarescan_in | Symbolic Name for LSI_MBISRC_FLARESCAN_IN pin |
| mbisr_flarescanout | Symbolic Name for LSI_MBISR_FLARESCANOUT pin |
| poweron_clk | Symbolic Name for LSI_POWERON_CLK pin |
| bz_resetn | Symbolic Name for LSI_BZ_RESETN pin |
| bz_clock | Symbolic Name for LSI_BZ_CLK pin |
| bz_scan_out | Symbolic Name for LSI_SCAN_OUT pin of BZ controller |
| mbist_cmp_stat | Symbolic Name for LSI_MBIST_CMP_STAT pin |
| rram_test_clock | Symbolic Name for LSI_RRAM_TEST_CLOCK pin |
| rram_test_out | Symbolic Name for LSI_RRAM_TEST_OUT pin |
| rram_clock | Symbolic Name for LSI_RRAM_CLOCK pin |

*FIG. 1*

METHOD AND SYSTEM OF GENERIC IMPLEMENTATION OF SHARING TEST PINS WITH I/O CELLS

FIELD OF THE INVENTION

The present invention generally relates to the field of integrated circuits, particularly to a method and a system of generic implementation of sharing test pins with I/O (Input/Output) cells.

BACKGROUND OF THE INVENTION

Many different types of test pins and many different I/O cells exist. Often, I/O cells cannot be used for sharing certain types of test pins. The type of special I/Os and the type of different test pins are increasing every day. It is getting very difficult to keep up with these new I/O cells and to ask customers to tune their inputs to test tools so that a proper I/O cell is used for the test pin. Moreover, if the customer overlooks or forgets to follow the restrictions, cost is very high and the IC design may go on proto-hold. Additionally, problems may appear while running pattern generation. A failure to rapidly identify the problem in test sharing may cause a tight schedule or even a delay. Thus, it is desirable to provide a new generic approach for sharing test pins.

SUMMARY OF THE INVENTION

Accordingly, the present invention is directed to a method and a system of generic implementation of sharing test pins with I/O (Input/Output) cells. In an exemplary aspect of the present invention, a method of generic implementation of sharing test pins with I/O cells includes a step of making a general change in a testlib file. The testlib file is suitable for controlling I/O cell pins to gain test access. The general change restricts I/O cells for sharing with test pins. The method further includes a step of making iogen changes for sharing. Optionally, the method may include a step of making a cell level change in the testlib file. The cell level change overrides restrictions defined by the general change.

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 1 shows symbolic names for test pins in iogen in accordance with an exemplary embodiment of the present invention.

DETAILED DESCRIPTION OF THE INVENTION

Figure 2:
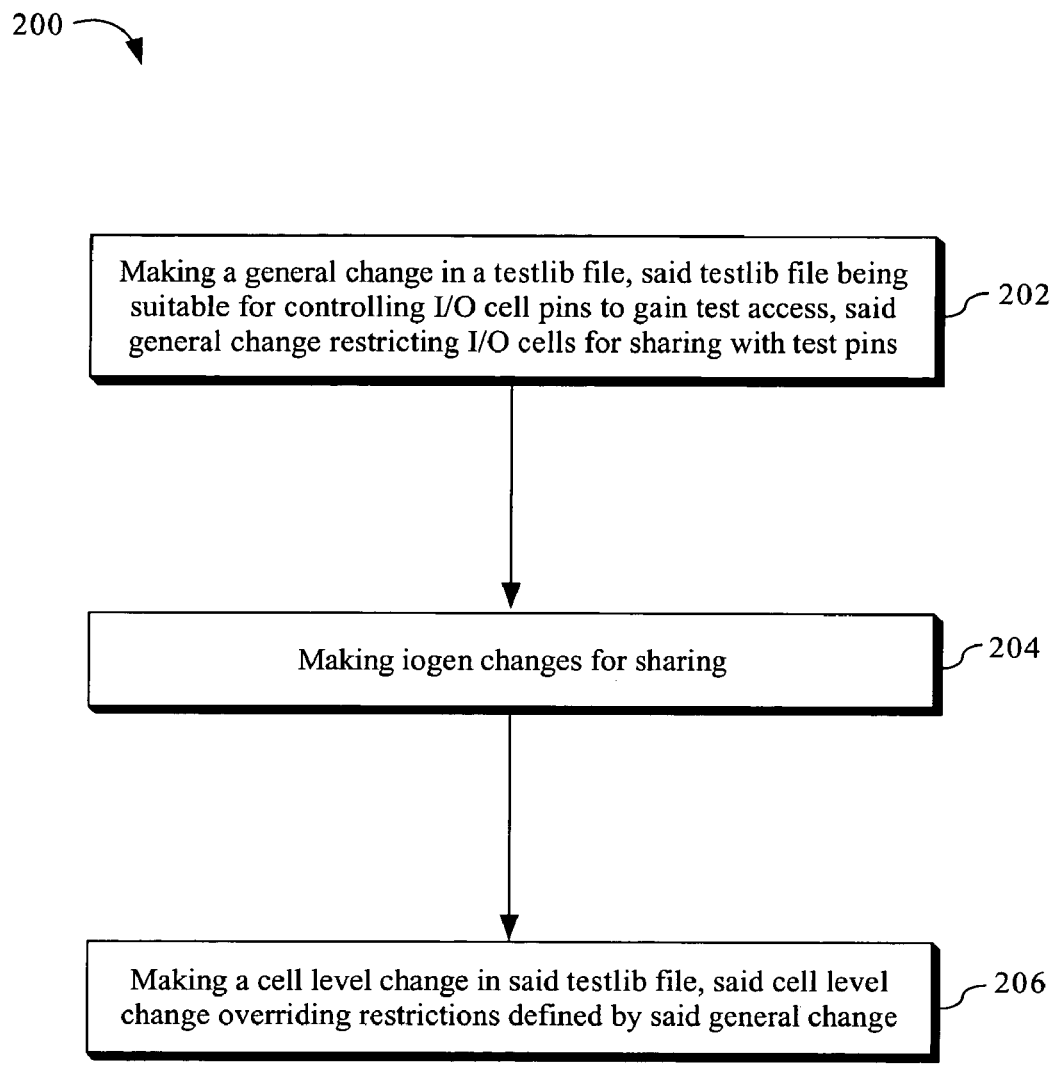
FIG. 2 is a flowchart of a method of generic implementation of sharing test pins with I/O cells in accordance with an exemplary embodiment of the present invention.

Reference will now be made in detail to the presently preferred embodiments of the invention, examples of which are illustrated in the accompanying drawings.

Test pin sharing may be implemented by iogen (i.e., IOGEN). IOGEN (Input/Output device GENeration) is a software tool for generation of netlist for custom I/O cells based upon user specified parameters. In iodef file, there are options (-sharable and -not_sharable) which notify iogen whether to share an I/O cell for the test pin. Customers are supposed to provide their selections in iodef file. In other words, customers may need to know about each I/O cell they are using and may also need to know how each test method works. In the absence of these options or customers' selections, iogen uses random I/O cells (except inverting I/O cells) for sharing. Thus, there is a chance of using an I/O cell for a test pin, which may be not allowed. In LSI Logic Corp.'s Rapidchip flow, sharing of test pins is implemented by a test share file which is generated by Rapidbuilder. Thus, Rapidbuilder also needs to implement the same rules while choosing I/O cells for test pins. Apart from this, iogen also includes a hardcoded list of cell prefixes which cannot be used for sharing. However, in reality a customer may sometimes need to use an I/O cell in the hardcoded list for test pin sharing, which may require code changes and providing a new binary to the customer for supporting tactical needs.

Iogen reads a file called <technology>.testLib (i.e., testlib) which is used for controlling I/O cell pins for gaining test access. The present invention provides a new method and system to control sharing of test pins with I/O cells for different modes. The present invention may be able to specify what type of test pins cannot be shared with what type of I/O. The I/O type needs to be based on techlib property (documented or undocumented) or derived agreed property between test methodolgy and test tools development (via arcs). The present invention may be able to specify the iodef file command options (e.g., add_cell, add_port commands, or the like) while giving sharing restrictions. Sometimes, an I/O cell, if used in a certain way via iodef file options (e.g., -input$_{13}$ only, -output_only, -respect_dir, or the like), cannot be used for sharing a certain type of test pins. The present invention may be able to specify wildcards for test pins. For example, there are so many types of test clock pins that the present invention may need not list each type of clock pins, but rather specify *_clock or equivalent. The present invention may be able to override the general sharing restriction with buffer specific information. For example, in accordance with a general restriction, a certain type of I/O may not be shared with a specific test pin. However, the present invention may be able to specify that a specific I/O cell of that type can be used for a certain type of test pin sharing. This may support some IC designs where the general rule need not be followed. FIG. 1 shows symbols supported in iogen for test pin sharing in accordance with an exemplary embodiment of the present invention.

FIG. 2 is a flowchart of a method 200 of generic implementation of sharing test pins with I/O cells in accordance with an exemplary embodiment of the present invention. The method 200 starts with a step 202, in which a general change is made in a testlib file. The testlib file is suitable for controlling I/O cell pins to gain test access, and the general change restricts I/O cells for sharing with test pins. Preferably, the general change includes:

```
SharingRestriction(<list of symbols separated by comma. Wildcards
accepted>) {
    statement
}                                                                    (&)
``` where SharingRestriction(<list of symbols separated by comma. Wildcards accepted>) {lists only the symbol names identified in FIG. 1, separated by comma, and this restriction or rule is applied to all pins of those symbols in that category. The following are some examples:

SharingRestriction(scan_in) {

The foregoing restriction is applied to scan_in (LSI_SCAN_IN) test pins while checking for valid I/O cells type.

SharingRestriction(*_clock,*_clk) {

The foregoing restriction is applied to all types of clock test pins (scan_clock, lbram_scan_clock, mbist_clock, poweron_clk, bz_clock, rram_test_clock, $rram_{13}$ clock, and the like) while checking for valid I/O cells type.

SharingRestriction(*) {

The foregoing restriction is applied to all types of test pins as defined in FIG. 1 while checking for valid I/O cells type.

It is understood that the statement in the foregoing described general change or syntax (&) may be a single statement or may be a plurality of statements without departing from the scope and spirit of the present invention. For the general change (&) to be successful, all of the statements in general change (&) need to be true. A certain type of statement may be repeated twice. A statement may have multiple values separated by commas, and for that statement to be true for sharing rule, only one of them needs to be true. The description of some exemplary statements is now in order.

A. Cell_Types: <List of Techlib Cell Types Separated by Comma>;

The foregoing statement is true if an I/O cell contains techlib cell type which is one in the list specified by cell_types. The following are some examples:
   cell_types: sstl2, bz, differential;

In above statement, if an I/O cell contains sstl2 or bz or differential cell level property, then this sharing rule is applied to the I/O cell.
   cell_types: sstl2;
   cell_types: bz;

The above two statements are in the testlib for a sharing rule. For the sharing rule to be applied to the I/O cell, the I/O cell must have sstl2 and bz as cell level types.

B. Undocumented: <List of Cell Level Undocumented Properties and their Values>;

For the foregoing statement to be true for the sharing rule, an I/O cell must have undocumented property and a value for undocumented property to be the same as specified in the foregoing statement. Like cell_types, undocumented properties may be listed in multiple statements where each statement must be true. The following is an example:
   undocumented: custom_test=1, clock_cell=1;

For the foregoing sharing rule to be applied to an I/O cell, the I/O cell must have either undocumented properties as custom_test and its value as 1 or undocumented properties as clock_cell and its value as 1.

C. Derived_Property: <List of Derived Properties Agreed Between Test Methodology and Test Tools Development>;

The foregoing statement includes a derived property where complicated rules need to be applied to the I/O cell to derive the property as this property is not directly available from techlib. Derived property of the I/O cell may be based on combination of pins property, arcs and several others combination. Like other statements, if one of the derived property is true then the underlying sharing rule is true. The following is an example:
   derived_property: derivedProperty1, derivedProperty2;

D. Iodef_File_Options: <List of Options used in Iodef File for Add_Cell Command>;

The foregoing statement includes the list of iodef file add_cell command options. There are certain options in iodef file add_cell command when used and an I/O cell cannot be used for a certain type of test pins. The following are some examples:
   iodef_file_options: input_only, output_only;

In above statement, an I/O cell cannot be used for sharing if the I/O cell has been used with input_only or output_only option. If one desires multiple options to be true then one may define them in multiple statements as shown below:
   iodef_file_options: input_only, output_only;
   iodef_file_options: respect_dir;

In above statements, an I/O cell cannot be used for sharing if the I/O cell has been used with input_only or output_only option, along with respect_dir option.

Below is an example (not in reality) to illustrate the usage of testlib, which includes all of the foregoing statements:

```
SharingRestriction(*_clock,*_clk) {
   cell_types: sstl2, bz, differential;
   undocumented: custom_test=1, clock_cell=1;
   derived_property: derivedProperty1, derivedProperty2;
   iodef_file_options: input_only, output_only;
   iodef_file_options: respect_dir;
}
```

Thus, according to the foregoing rules in testlib file, any test clock may not be shared with an I/O cell having the following characteristics:

(1) Cell type is either bz or sstl2 or differential;
   (2) Cell has undocumented property custom_test or clock_cell;
   (3) Cell has one of the derived property from derivedProperty1 or derivedProperty2; and
   (4) This I/O cell is being used in iodef file as input_only or output_only with respect_dir option.

Still referring to FIG. 2, iogen changes are made for sharing 204. The iogen changes may include at least one of the following:

(a) In iodef file add_cell command, there are options such as -sharable and -not_sharable. These options notify iogen to choose or not choose that port for preferred sharing;
   (b) There will not be any changes in functionality of -not_sharable option in iogen. It will continue to work as usual;
   (c) There will be changes for -sharable option. If a user uses -sharable option, then this cell may not have restriction for that test pin if shared. For example, suppose PCI I/O cell is not allowed to share with scan_clock test pin, but a user selects this PCI I/O cell for scan_clock test pin sharing, then the user will get an error that the user either needs to change the shared port for scan clock or contact test methodology to have an override;
   (d) Conventionally, if a user specifies -sharable for an I/O cell, then iogen selects that port for sharing with any test pins as long as it does not violate test methodology (e.g., scan_in pin cannot be shared with clocks/resets). However, according to the present invention, iogen may use this I/O cell for sharing with test pins when it does not violate testlib restrictions. A warning may be issued if a functional port is defined as -sharable but it has not been used for sharing with any test pins; and (e) Iogen does not allow inverting I/O cells to be shared with test pins.

Continuing to refer to FIG. 2, a cell level change is made in the testlib file, in which the cell level change overrides restrictions defined by the general change 206. In the step 202, all the cells having properties are avoided for sharing. However, there are some cases where an I/O cell needs to have ability to override restrictions defined by the general change implemented in the step 202. The cell level change may include the following syntax:

```
Cell(<CellName>) {
    allow_sharing(<list of symbols separated by comma. Wildcards
    accepted>) {
        iodef_file_options: <list of options used in iodef file for add_cell
        command>;
    }
}
```

In above syntax, an I/O cell will be allowed for sharing even though the I/O cell may be restricted for sharing for some types of test pins in SharingRestriction statement. One may also specify whether this I/O cell is allowed for sharing if used in a certain way based on iodef file options. The following is an example:

```
Cell(BDZSSTLI9I16DDRJLS25RC) {
    allow_sharing(scan_clock, scan_reset) {
        iodef_file_options: input_only;
        iodef_file_options: respect_dir;
    }
}
```

In the foregoing syntax, cell BDZSSTLI9I16DDRJLS25RC is allowed for sharing scan_clock and scan_reset when used in iodef file as input_only with respect_dir option, even though the sharing may not be allowed according to general sharing rules.

It is understood that there are cases where property, derived property, iodef file options may not be sufficient to determine if an I/O cell is sharable for certain test pins. The following cell level change may notify iogen not to share an I/O cell with a specific type of test pins:

```
Cell(<CellName>) {
    not_allow_sharing(<list of symbols separated by comma. Wildcards
    accepted>){
    }
}
```

In the foregoing syntax, an I/O cell may not be allowed for sharing with test pins listed in FIG. 1. However, usage of this syntax should be minimized. If there are cases where allow_sharing and not_allow_sharing are defined for the same cell and for the same test pin type, then an error may be issued. For example,

```
Cell(SCSILVLDJLS25) {
    not_allow_sharing(*_clock, *_reset*) {
    }
}
```

In this example, Cell SCSILVLDJLS25 may not be allowed for sharing test clocks and test resets. It is understood that a cell definition for sharing always takes precedence over the general sharing rules as defined in the foregoing described syntax (&).

It is to be noted that the above described embodiments according to the present invention may be conveniently implemented using conventional general purpose digital computers programmed according to the teachings of the present specification, as will be apparent to those skilled in the computer art. Appropriate software coding may readily be prepared by skilled programmers based on the teachings of the present disclosure, as will be apparent to those skilled in the software art.

It is to be understood that the present invention may be conveniently implemented in forms of software package. Such a software package may be a computer program product which employs a computer-readable medium including stored computer code which is used to program a computer to perform the disclosed function and process of the present invention. The computer-readable medium may include, but is not limited to, any type of conventional floppy disks, optical disks, CD-ROMS, magneto-optical disks, ROMs, RAMs, EPROMs, EEPROMs, magnetic or optical cards, or any other suitable media for storing electronic instructions.

It is understood that the specific order or hierarchy of steps in the processes disclosed is an example of exemplary approaches. Based upon design preferences, it is understood that the specific order or hierarchy of steps in the processes may be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method of generic implementation of sharing test pins with I/O cells, comprising:
   making a general change in a testlib file, said testlib file being suitable for controlling I/O cell pins to gain test access, said general change restricting I/O cells for sharing with test pins; and
   making iogen changes for sharing,
   wherein said general change includes:

```
SharingRestriction(<list of symbols separated by comma. Wildcards
accepted>) {
    statement
}.
``` wherein inverting I/O cells are prohibited from being shared with the test pins.

2. The method of claim 1, wherein said statement includes:
   $cell_{13}$ types: <list of techlib cell types separated by comma>.

3. The method of claim 1, wherein said statement includes:

undocumented: <list of cell level undocumented properties and their values>.

4. The method of claim 1, wherein said statement includes:

derived$_{13}$ property: <list of derived properties agreed between test methodology and test tools development>.

5. The method of claim 1, wherein said statement includes:

iodef$_{13}$ file$_{13}$ options: <list of options used in iodef file for add$_{13}$ cell command>.

6. A method of generic implementation of sharing test pins with I/O cells, comprising:

making a general change in a testlib file, said testlib file being suitable for controlling I/O cell pins to gain test access, said general change restricting I/O cells for sharing with test pins;

making iogen changes for sharing; and making a cell level change in said testlib file, said cell level change overriding restrictions defined by said general change, wherein inverting I/O cells are prohibited from being shared with the test pins.

7. The method of claim 6, wherein said cell level change includes:

```
Cell(<CellName>) {
    allow_sharing(<list of symbols separated by comma. Wildcards
    accepted>) {
        iodef_file_options: <list of options used in iodef file for
        add_cell command>;
    }
}.
```

8. The method of claim 6, wherein said cell level change includes:

```
Cell(<CellName>) {
    not_allow_sharing(<list of symbols separated by comma.
    Wildcards accepted>){
    }
}.
```

9. A system of generic implementation of sharing test pins with I/O cells, comprising:

means for making a general change in a testlib file, said testlib file being suitable for controlling I/O cell pins to gain test access, said general change restricting I/O cells for sharing with test pins; and means for making iogen changes for sharing, wherein said general change includes:

```
SharingRestriction(<list of symbols separated by comma. Wildcards
accepted>) {
    statement
}.
``` wherein inverting I/O cells are prohibited from being shared with the test pins.

10. The system of claim 9, wherein said statement includes:

cell$_{13}$ types: <list of techlib cell types separated by comma>.

11. The system of claim 9, wherein said statement includes:

undocumented: <list of cell level undocumented properties and their values>.

12. The system of claim 9, wherein said statement includes:

derived$_{13}$ property: <list of derived properties agreed between test methodology and test tools development>.

13. The system of claim 9, wherein said statement includes:

iodef$_{13}$ file$_{13}$ options: <list of options used in iodef file for add$_{13}$ cell command>.

14. A system of generic implementation of sharing test pins with I/O cells, comprising:

means for making a general change in a testlib file, said testlib file being suitable for controlling I/O cell pins to gain test access, said general change restricting I/O cells for sharing with test pins;

means for making iogen changes for sharing; and means for making a cell level change in said testlib file, said cell level change overriding restrictions defined by said general change, wherein inverting I/O cells are prohibited from being shared with the test pins.

15. The system of claim 14, wherein said cell level change includes:

```
Cell(<CellName>) {
    allow_sharing(<list of symbols separated by comma. Wildcards
    accepted>) {
        iodef_file_options: <list of options used in iodef file for
        add_cell command>;
    }
}.
```

16. The system of claim 14, wherein said cell level change includes:

```
Cell(<CellName>) {
    not_allow_sharing(<list of symbols separated by comma.
    Wildcards accepted>) {
    }
}.
```

17. A computer-readable medium having computer-executable instructions for performing a method of generic implementation of sharing test pins with I/O cells, said method comprising:

making a general change in a testlib file, said testlib file being suitable for controlling I/O cell pins to gain test access, said general change restricting I/O cells for sharing with test pins;

making iogen changes for sharing; and making a cell level change in said testlib file, said cell level change overriding restrictions defined by said general change, wherein inverting I/O cells are prohibited from being shared with the test pins.

* * * * *